United States Patent
Yamada et al.

[11] Patent Number: 5,907,259
[45] Date of Patent: May 25, 1999

[54] OPERATIONAL AMPLIFICATION CIRCUIT CAPABLE OF DRIVING A HIGH LOAD

[75] Inventors: Toshimi Yamada, Miyazaki; Hisao Ohtake, Tokyo, both of Japan

[73] Assignee: Oki Electric Industry Co., Ltd., Tokyo, Japan

[21] Appl. No.: 08/804,259

[22] Filed: Feb. 21, 1997

[30] Foreign Application Priority Data

Feb. 23, 1996 [JP] Japan ................................. 8-036190

[51] Int. Cl.[6] .................................................. H03F 3/16
[52] U.S. Cl. ........................ 327/563; 327/560; 327/561; 327/562; 330/253; 330/255; 330/261
[58] Field of Search .................................. 330/253, 255, 330/261; 327/52, 58, 65, 66, 560, 561, 562, 563

[56] References Cited

U.S. PATENT DOCUMENTS

| | | | |
|---|---|---|---|
| 4,800,339 | 1/1989 | Tanimoto et al. | 330/253 |
| 5,083,051 | 1/1992 | Whatley et al. | 307/571 |
| 5,142,244 | 8/1992 | Glica et al. | 330/253 |
| 5,194,824 | 3/1993 | Wu et al. | 330/255 |
| 5,289,058 | 2/1994 | Okamoto | 307/490 |

FOREIGN PATENT DOCUMENTS 4-310006  11/1992  Japan .

OTHER PUBLICATIONS

IEEE Journal of Solid–State Circuits, vol. 25, No. 3, Jun. 1, 1990, pp. 684–691; L.G.A. Callewaert et al., "Amplifiers with High Efficiency", p. 687, figure 5.

Primary Examiner—Timothy P. Callahan
Assistant Examiner—Minh Nguyen
Attorney, Agent, or Firm—Rabin & Champagne, P.C

[57] ABSTRACT

An operational amplification circuit having no crossover distortion includes a pair of differential amplification circuits, a pair of level shift circuits, a pair of current source circuits, and an output circuit. Each of the differential amplification circuits includes two MOS transistors having gates connected to a respective pair of input terminals. The differential amplification circuits generate first and second signals. The level shift circuits connected to the differential amplification circuits shift the level of the first and second signals. Each of the level shift circuits includes complementary MOS transistors. The current source circuits supply a predetermined current to one of the transistors of the level shift circuits. The output circuit is connected to the level shift circuits for generating an output signal.

16 Claims, 3 Drawing Sheets

OPERATIONAL AMPLIFICATION CIRCUIT CAPABLE OF DRIVING A HIGH LOAD

BACKGROUND OF THE INVENTION

1. Field of the Invention

The present invention relates to an operational amplification circuit, and, more particularly, to an operational amplification circuit capable of driving a high load and suitable for an apparatus such as a portable telephone, in which a voice is amplification object.

2. Description of the Related Art

Conventionally, when an operational amplification circuit capable of driving a high load is structured, a push-pull type amplification circuit is used, however, in this operational amplification circuit, a phenomenon, in which an output waveform is distorted, called a crossover distortion occurs. Therefore, contrivances are given to reduce a crossover distortion to the an operational amplification circuit used for amplifying a signal such as a voice, which requires an accurate wave amplification.

For instance, Japanese Patent Application Laid-Open No. 4-310006 in 1992 discloses an operational amplification circuit showing this structure. As shown in FIG. 3, an operational amplification circuit 30 consists of a first differential amplification circuit 31, a second amplification circuit 32, and an output amplification circuit 35. The operational amplification circuit 30 is also provided with phase compensation circuits 33, 34 each consisting of a capacitor C and a resistance R. The phase compensation circuits 33, 34 are implemented to prevent the operational amplification circuit 30 from oscillating and have no relation to an amplification action, so that no explanation is given for these circuits.

The first differential amplification circuit 31 consists of P channel metal oxide semiconductor field effect transistors (hereinafter, called PMOS) 81, 82 and N channel metal oxide semiconductor field effect transistors (hereinafter, called NMOS) 83–85.

Gates of the NMOSes 83, 84 are connected with an IN1 and an IN2, respectively, which are input terminals of the operational amplification circuit 30. Sources of the NMOSes 83, 84 are connected with a drain of the NMOS 85 of which a source is connected with the GND and a gate is supplied with a control signal for setting a bias voltage. Drains of the NMOSes 83, 84 are connected with drains of the PMOSes 81, 82, respectively. Sources of the PMOSes 81, 82 are connected with the $V_{DD}$ and gates of the PMOSes 81, 82 are connected with drain of the PMOS 81. And, an output is obtained from a connection point (node N8) between the drain of the PMOS 82 and the drain of the NMOS 84.

That is, the differential amplification circuit 31 generates a voltage in accordance with the voltage difference between the IN1 and the IN2 at the node N8. For instance, when the voltage of the IN1 is higher than that of the IN2, a voltage close to the $V_{DD}$ level is outputted from the node N8, and when the voltage of the IN2 is higher than that of the IN1, a voltage close to the GND level is outputted from the node N8.

The second differential amplification circuit 32 consists of NMOSes 89, 90 and PMOSes 86–88. Gates of the PMOSes 87, 88 are connected with the IN1 and the IN2, respectively. Sources of the PMOSes 87, 88 are connected with a drain of the NMOS 86 of which a source is connected with the $V_{DD}$ and a gate is supplied with a control signal for controlling a bias voltage. Drains of the PMOSes 87, 88 are connected with drains of the NMOSes 89, 90, respectively. Sources of the NMOSes 89, 90 are connected with the GND and gates of the NMOSes 89, 90 are connected with a drain of the NMOS 89. And, an output is obtained from a connection point (node N9) between drain of the NMOS 90 and the drain of the PMOS 88.

That is, the second differential amplification circuit 32 operates complementally with the first differential amplification circuit 31. In the second differential amplification circuit 31, when the voltage of the IN1 is higher than that of the IN2, a voltage close to the $V_{DD}$ level is outputted from the node N9, and when the voltage of the IN1 is lower than that of the IN2, a voltage close to the $V_{DD}$ level is outputted from the node N9.

The output amplification circuit 35 consists of a PMOS 91, a NMOS 92 and a resistance RX. A source of the PMOS 91 and a source of the NMOS 92 are connected with the $V_{DD}$ and the GND, respectively. A drain of the PMOS 91 is connected with a drain of the NMOS 92, and the connection point therebetween is connected with the output terminal OUT for the operational amplification circuit 30. A gate of the PMOS 91 and a gate of the NMOS 92 are connected with the node N8 in the first differential amplification circuit 31 and the node N9 in the second differential amplification circuit 32, respectively.

Now, a crossover distortion occurs when the both MOSes in the output amplification circuit 35 transit simultaneously between an on-state and an off-state. As described above, in the operational amplification circuit 30, signals are inputted from independent circuits to the gate of the PMOS 91 and the gate of the NMOS 92 in the output amplification circuit 35, respectively. Thus, the operational amplification circuit 30 is easy to design so as not to occur a crossover distortion.

Moreover, in the operational circuit 30, the resistance RX is arranged between the gates of the PMOS 91 and the NMOS 92 in the output amplification circuit 35, therefore, when one of the differential amplification circuits 31, 32 stops the operation thereof because a low power voltage is used, an output from an operative differential amplification circuit is supplied to the both MOSes in the output amplification circuit 35. Therefore, the operational amplification circuit 30 is normally operative in that case.

However, the operational amplification circuit 30 is provided with a resistance so as to be operative normally under a low power voltage. As the result, there is a problem in that a large area is needed for fabricating the operational amplification circuit 30. And, when the operational amplification circuit 30 drives a high load under a low power voltage, a current runs through the resistance RX, so that there is another problem in that a consumption power increase.

SUMMARY OF THE INVENTION

Accordingly, the present invention is achieved in view of the above situation, and it is an object of the present invention to provide an operational amplification circuit, in which no crossover distortion occurs, capable of driving a high load under a power voltage.

To achieve the above object, in a first aspect of the present invention, an operational amplification circuit is provided with a first differential amplification circuit, a second differential amplification circuit, a first level shift circuit, a second level shift circuit, a first current source, a second current source and an output circuit.

The first differential amplification circuit has a N-channel MOS transistor of which a gate is connected with a first input terminal and a N-channel MOS transistor of which a gate is connected with a second input terminal and outputs a voltage in accordance with a voltage difference between the first input terminal and the second input terminal. The second differential amplification circuit has a P-channel MOS transistor of which a gate is connected with the first input terminal and a P-channel MOS transistor of which a gate is connected with the second input terminal and outputs a voltage in accordance with the voltage difference between the first input terminal and the second input terminal.

The first level shift circuit has a P-channel MOS transistor of which a gate is applied with the voltage outputted from the first differential amplification circuit and a N-channel MOS transistor and outputs a voltage obtained by shifting a level of the voltage applied to the P-channel MOS transistor. The second level shift circuit has a N-channel MOS transistor of which a gate is applied with the voltage outputted from the second differential amplification circuit and a P-channel MOS transistor and outputs a voltage obtained by shifting a level of the voltage applied to the N-channel MOS transistor.

The first current source supplies a first predetermined level current to the N-channel MOS transistor in the first level shift circuit. The second current source supplies second predetermined level current to the P-channel MOS transistor in the second level shift circuit. The output circuit has a P-channel MOS transistor of which a gate is applied with the voltage outputted from the first level shift circuit and a N-channel MOS transistor of which a gate is applied with the voltage outputted from the second level shift circuit and outputs a voltage in accordance with states of the both transistors.

That is, according to the operational amplification of the first aspect, the voltage, which is outputted from the first differential amplification circuit for controlling the N-channel MOS transistor, is converted to a voltage for controlling the P-channel MOS transistor by the first level shift circuit. And, the first current source is operative to define an upper limit value for the converted voltage. Further, in the operational amplification of the first aspect, the voltage, which is outputted from the second differential amplification circuit for controlling the P-channel MOS transistor, is converted to a voltage for controlling the P-channel MOS transistor by the second level shift circuit. And, the second current source is operative to define a lower limit value for the converted voltage.

Therefore, according to this operational amplification circuit structured as above, it is easy to design in a manner that the both MOSes in the output circuit transit non-simultaneously between the on-state and the off-state, that is, no crossover distortion occurs. And, when one of the differential amplification circuit stops the operation thereof because a low power voltage is used, a constant voltage is applied to a gate of the MOS corresponding to the no-operation differential amplification circuit in the output circuit. As the result, this operational amplification circuit also operates normally in that case.

According to a second aspect of the present invention, an operational amplification circuit is provided with a first differential amplification circuit, a second differential amplification circuit, a level shift circuit, a current source and an output circuit.

The first differential amplification circuit has a N-channel MOS transistor of which a gate is connected with a first input terminal and a N-channel MOS transistor of which a gate is connected with a second input terminal and outputs a voltage with a same phase as a voltage difference between the first input terminal and the second input terminal in accordance with the voltage difference. The second differential amplification circuit has a N-channel MOS transistor of which a gate is connected with the first input terminal and a N-channel MOS transistor of which a gate is connected with the second input terminal and outputs a voltage with an opposite phase to the voltage difference between the first input terminal and the second input terminal in accordance with the voltage difference.

The level shift circuit has a P-channel MOS transistor of which a gate is applied with the voltage outputted from the first differential amplification circuit and a N-channel MOS transistor and outputs a voltage obtained by shifting a level of the voltage applied to the P-channel MOS transistor. The current source supplies a predetermined level current to the N-channel MOS transistor in the level shift circuit. The output circuit has a P-channel MOS transistor of which a gate is applied with the voltage outputted from the second level shift circuit and a N-channel MOS transistor of which a gate is applied with the voltage outputted from the level shift circuit and outputs a voltage in accordance with states of the both transistors.

That is, in the operational amplification of the second embodiment, the voltage, which is outputted from the first differential amplification circuit for controlling the N-channel MOS transistor, is converted to a voltage for controlling the P-channel MOS transistor in the output circuit by the level shift circuit. And, the current source is operative to define an upper limit value for the converted voltage. Then, in the operational amplification of the second embodiment, the output from the second differential amplification circuit is directly used for controlling the N-channel MOS transistor in the output circuit.

Therefore, according to this operational amplification circuit structured as above, it is easy to design in a manner that the both MOSes in the output circuit transit non-simultaneously between the on-state and the off-state, that is, no crossover distortion occurs. And, when the first differential amplification circuit stops the operation thereof because a low power voltage is used, a constant voltage is applied to a gate of the P-channel MOS transistor. As the result, this operational amplification circuit also operates normally in that case.

In addition, when an operational amplification circuit according to the first or the second embodiment is fabricated, it is desirable to add a power-down circuit which applies a voltage to a gate of the N-channel MOS transistor for controlling the N-channel MOS transistor in the output circuit so as to be in an off-state and applies a voltage to a gate of the P-channel MOS transistor for controlling the P-channel MOS transistor in the output circuit so as to be in an off-state when a predetermined control signal is input. A operational amplification circuit is structured as above, whereby a consumption power can be reduced during an unused time.

BRIEF DESCRIPTION OF THE DRAWINGS

The present invention will become more fully understood from the detailed description given hereinbelow and the accompanying drawings in which.

DETAILED DESCRIPTION OF THE PREFERRED EMBODIMENTS

Preferred embodiments of the present invention will now be described with reference to the accompanying drawings.

First Embodiment

Figure 1:
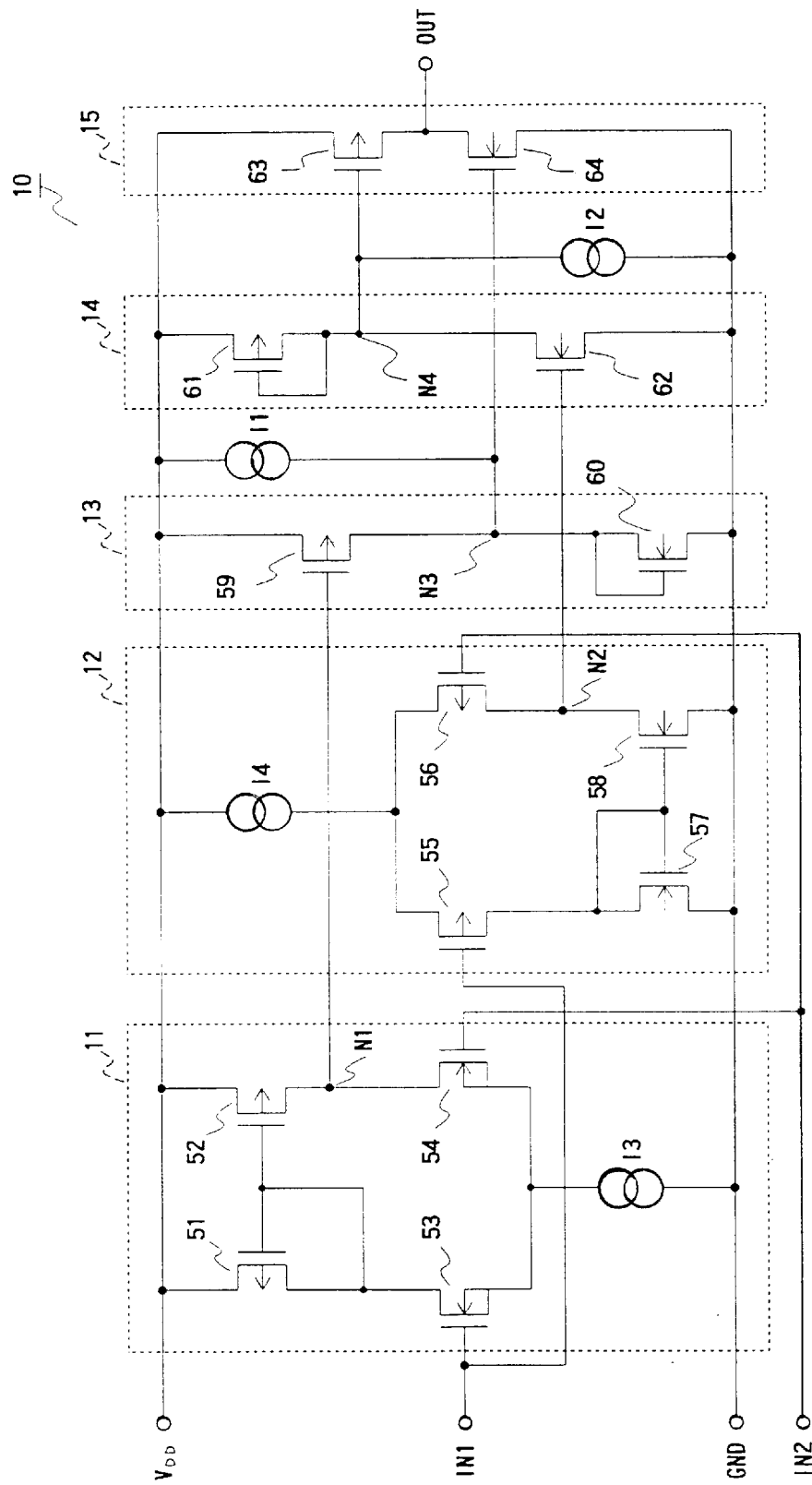
FIG. 1 is a circuit diagram illustrating a structure of an operational amplification circuit according to the first embodiment of this invention.

FIG. 1 shows a structure of an operational amplification circuit according to the first embodiment of the present invention. Hereinafter, the explanation will be given of the structure and the operation of the operational amplification circuit 10 with reference to FIG. 1.

As shown in FIG. 1, the operational amplification circuit 10 of the first embodiment is provided with a first differential amplification circuit 11, a second differential amplification circuit 12, a first level shift circuit 13, a second level shift circuit 14, a first current source I1, a second current source I2 and an output circuit 15.

Figure 3:
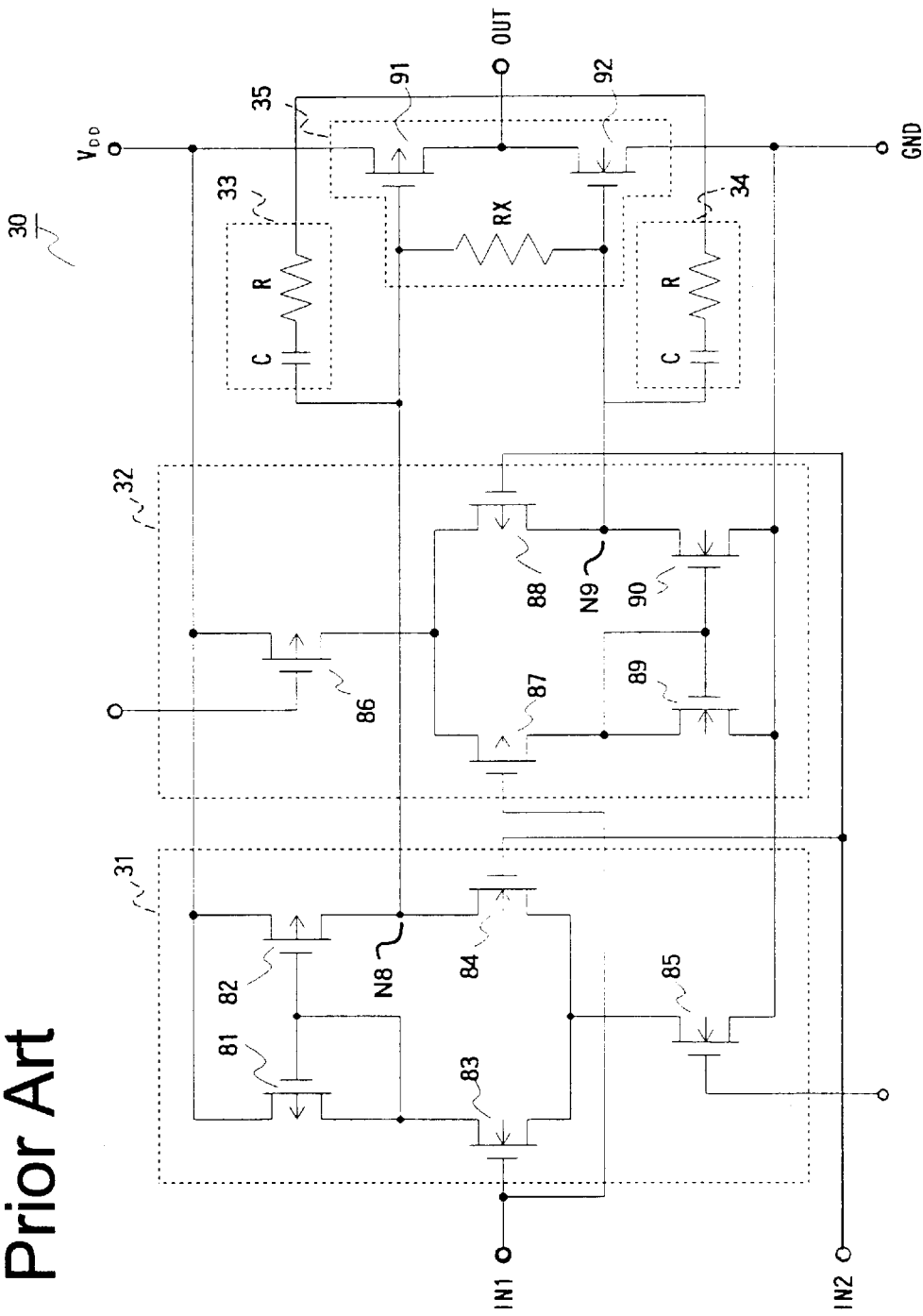

The first differential amplification circuit 11, however, includes a current source I3 instead of the PMOS 85, and it is essentially equivalent to the first differential amplification circuit 31 show in FIG. 3. Similarly, the second differential amplification circuit 12 is equivalent to the second differential amplification circuit 32. That is, the first differential amplification circuit 31 varies level of an output voltage from the node N1 in accordance with the voltage difference between the IN1 and the IN2. The second differential amplification circuit 32 varies level of an output voltage from the node N2 in accordance with the voltage difference between the IN1 and the IN2 though ranges of the output voltages are different.

The node N1 of the first differential amplification circuit 11 and the node N2 of the second differential amplification circuit 12 are connected with the first level shift circuit 13 and the second level shift circuit 14, respectively.

The first level shift circuit 13 consists of a PMOS 59 and a NMOS 60. The node N1 in the first differential amplification circuit 11 is connected with a gate of the PMOS 59 of which a source is connected with the $V_{DD}$. A drain of the PMOS 59 is connected with a drain and a gate of the NMOS 60 of which a source is connected with the GND.

The second level shift circuit 14 consists of a PMOS 61 and a NMOS 62. The node N2 of the second differential amplification circuit 12 is connected with a gate of the NMOS 62 of which a source is connected with the GND. A drain of the NMOS 62 is connected with a drain and a gate of the PMOS 61 of which a source is connected with the $V_{DD}$.

The output circuit 15 consists of a PMOS 63 and a NMOS 64. A source of the PMOS 63 and a source of the NMOS 64 are connected with the $V_{DD}$ and the GND, respectively. A gate of the NMOS 64 is connected with a connection point (node N3) between drains of the PMOS 59 and the NMOS 60 in the first level shift circuit 13, and a gate of the PMOS 63 is connected with a connection point (node N4) between drains of the PMOS 61 and the NMOS 62 in the second level shift circuit 14. A drain of the PMOS 63 is connected with a drain of the NMOS 64, and an output of the operational amplification circuit 10 is delivered from this connection point.

Then, the current source I1 is provided between the node N3 connected with the gate of the NMOS 64 and the $V_{DD}$. And, the current source I2 is arranged between the node N4 and the GND.

As above described, the first level shift circuit 13 in this operational amplification circuit, independently, outputs a voltage of a level close to the $V^{DD}$ level to the gate of the NMOS 64 when a voltage close to the GND is applied to the gate of the PMOS 59, and outputs a voltage with a level close to the GND level to the gate of the NMOS 64 when a voltage close to the GND is applied to the gate of the PMOS 59. However, the current source I1 is provided between the node N3 and the $V_{DD}$, so that a voltage, corresponding to a current value of the current source I1, is produced on the node N3 when the PMOS 59 in the first level shift circuit 13 becomes completely off. That is, in the operational amplification circuit 10, there is no case that a voltage of the GND level is applied to the gate of the NMOS 64 though the PMOS 59 is controlled to be in the off-state by the output of the first differential amplification circuit 11.

And, the second level shift circuit 14 outputs a voltage of a level close to the GND level from the node N4 when a voltage of a level close to the $V_{DD}$ level is applied to the gate of the NMOSes 62, and outputs a voltage of a level close to the $V_{DD}$ level from the node N4 when a voltage of a level close to the GND level is applied to the gate of the NMOS 62. However, the current source I2 is provided between the node N4 and the GND, so that there is no case in that a voltage of the $V_{DD}$ level, that is, a voltage to control the PMOS 63 to be in an off-state is applied to the node N4.

Thus, in the operational amplification circuit 10, there is no case in that the two MOSes in the output circuit 15 are controlled to become the off-state together. Therefore, according to the operational amplification circuit 10, signals can be amplified accurately without the effect of the crossover distortion.

Further, when one of the differential amplification circuit dose not operate as a result of an operation with a low power voltage (or as a result of a process fluctuation), a constant voltage is applied to a gate of a MOS corresponding to a no-operation differential amplification circuit. Therefore, the operational amplification circuit 10 operates normally in this case.

And, no resistance RX is provided, so that the operational amplification 10 can be fabricated compact.

Second Embodiment

Figure 2:
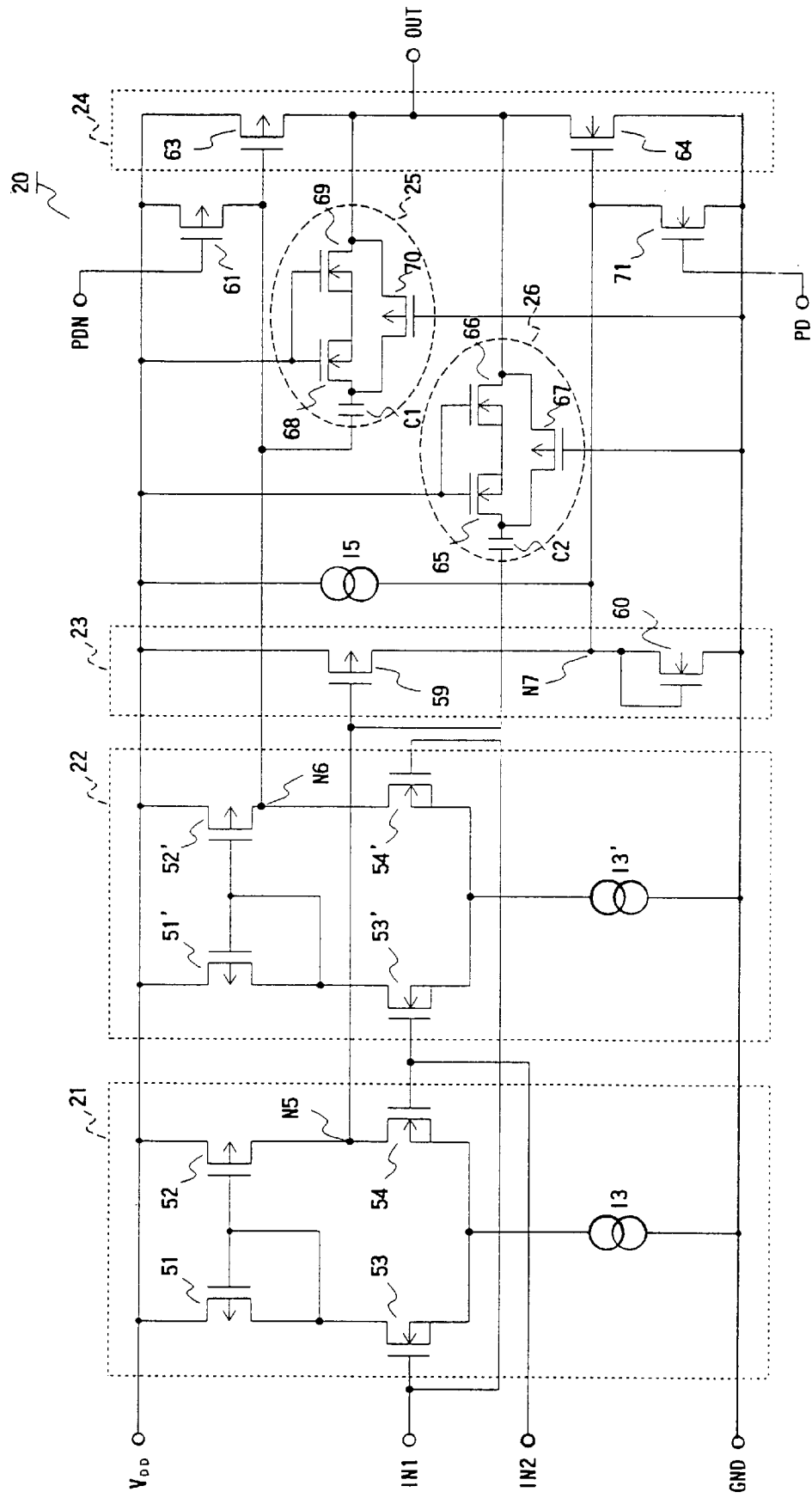
FIG. 2 is a circuit diagram illustrating a structure of an operational amplification circuit according to the second embodiment of this invention; and, FIG. 3 is a circuit diagram illustrating a structure of an conventional operational amplification circuit.

FIG. 2 shows a structure of an operational amplification circuit according to the second embodiment of the present invention. Hereinafter, the explanation will be given of the structure and the operation of the operational amplification circuit 20 with reference to FIG. 2.

As shown in FIG. 2, the operational amplification circuit 20 is provided with a first differential amplification circuit 21, a second differential amplification circuit 22, a level shift circuit 23, a output circuit 24 and a current source I5.

The first differential amplification circuit 21 has the same structure as the first differential operational circuit 11 in the first embodiment.

The second differential amplification circuit 22 also has the same structure as the first differential amplification circuit 11 in the first embodiment. However, a gate of the NMOS 54' in the second differential amplification circuit 22, which is a transistor corresponding to the NMOS 54 in the first differential amplification circuit 21 of the first embodiment, is supplied with a signal from not the IN2 but the IN1. And, a gate of the NMOS 53' in the second differential amplification circuit 22, which is a transistor corresponding to the NMOS 53 in the first differential amplification circuit 21, is supplied with a signal from not the IN1 but the IN2.

That is, the second differential amplification circuit 22 outputs a voltage of a level close to the GND level is generated at the node N6 when a voltage with a level close to the $V_{DD}$ level is generated at the node N5 in the first differential amplification circuit 21. And, the second differential amplification circuit 22 outputs a voltage with a level close to the $V_{DD}$ level is generated at the node N6 when a voltage with a level close to the GND level is generated at the node N5 in the first differential amplification circuit 21.

The node N5 of the first differential amplification circuit 21 is connected with a gate of the PMOS 59 in the level shift circuit 23 which has the same structure as the first level circuit 13 of the first embodiment. A connection point (node N7) between drains of the PMOS 59 and the NMOS 60 in the level shift circuit 23 is connected with a gate of the NMOS 64 in the output circuit 24. Then, the current source I5 is provided between the node N7 connected with the gate of the NMOS 64 and the $V_{DD}$.

And, the node N6 of the second differential amplification circuit 22 is connected with the gate of the PMOS 63 in the output circuit 24.

As described above, in the second amplification circuit 20, the PMOS 63 which is one MOS in the output circuit 24 is controlled directly by the output of the second differential amplification circuit 22, and the NMOS 64 which is the other MOS is controlled by the voltage at the node N7, namely, by the converted output of the first differential amplification circuit 21 with the level shift circuit 23 and the current source I5.

That is, the operational amplification circuit 20 is structured so as to set a voltage range applied to the gate of the NMOS 64 by a current value of the current source I5. Thus, the operational amplification circuit 20 is easy to design in a manner that the two MOSes are controlled not to be in the off-state together, similarly to the operational amplification circuit 10.

And, when the first differential amplification circuit dose not operate as a result of being supplied with a low power voltage (or as a result of a process fluctuation), a constant voltage is applied to the gate of the NMOS 64 in the output circuit 24. Therefore, the operational amplification circuit 20 also operates normally in this case.

In addition, the second operational amplification circuit 20 is provided with a first phase compensation circuit 25, a second phase compensation circuit 26, a PMOS 61 and a NMOS 71.

The first phase compensation circuit 25 consists of a capacitor C1 and three MOSes (NMOSes 68, 69, a PMOS 70) which function as resistance elements, and is provided between the node N6 of the second differential amplification circuit 22 and the output terminal OUT. The second phase compensation circuit 26 has the same structure as the first phase compensation circuit 25, and is provided between the node N5 of the first differential amplification circuit 21 and the output terminal OUT. The operational amplification circuit 20 can perform an amplification without an oscillation because these phase compensation circuits 25, 26 are provided.

The PMOS 61 and the NMOS 71 are provided to stop the operation of the operational amplification circuit 20 when the operational amplification circuit 20 is not used. As shown in FIG. 2, a source and a drain of the PMOS 61 are connected with the $V_{DD}$ and the gate of the PMOS 63, respectively. And, a source and a drain of the NMOS 71 are connected with the GND and the gate of the NMOS 64, respectively.

Signals PDN, PD are supplied to the gates of the PMOS 61 and the NMOS 71 from outer circuits not shown, respectively. The PMOS 61 and the NMOS 71 are controlled to be in the off-state together by these signals when the operational amplification circuit 20 operates. And, when the operation of the operational amplification circuit 20 is stopped, the PMOS 61 and the NMOS 71 are controlled to be in the on-state together by theses signals. As the result, the PMOS 63 and the NMOS 64 in the output circuit 24 become the off-state together, and the operation of the operational amplification circuit 20 is stopped.

As described above, the operational amplification circuit 20 is provided with a circuit for stopping the operation of the output circuit 24, so that if an apparatus which has a long time unnecessary to operate, such as an apparatus related to communications is structured with the operational amplification circuit 20, an apparatus with a low consumption power can be obtained.

This invention being thus described, it will be obvious that same may be varied in various ways. Such variations are not to be regarded as departure from the spirit and scope of the invention, and all such modifications would be obvious for one skilled in the art intended to be included within the scope of the following claims.

What is claimed is:

1. An operational amplification circuit comprising:
    a first differential amplification circuit including a first N-channel MOS transistor having a gate connected to a first input terminal, and a second N-channel MOS transistor having a gate connected to a second input terminal and generating a first signal having a voltage in accordance with a voltage difference between the first input terminal and the second input terminal;
    a second differential amplification circuit including a first P-channel MOS transistor having a gate connected to the first input terminal, and a second P-channel MOS transistor having a gate connected to the second input terminal and generating a second signal having a voltage in accordance with the voltage difference between the first input terminal and the second input terminal;
    a first level shift circuit including a third P-channel MOS transistor having a gate receiving the first signal, and a third N-channel MOS transistor, said first level shift circuit generating a third signal having a level that is shifted from the voltage of the first signal;
    a second level shift circuit including a fourth N-channel MOS transistor having a gate receiving the second signal, and a fourth P-channel MOS transistor, said second level shift circuit generating a fourth signal having a level that is shifted from the voltage of the second signal;
    a first current source circuit supplying a first predetermined current to the third N-channel MOS transistor;
    a second current source circuit supplying a second predetermined current to the fourth P-channel MOS transistor; and
    an output circuit including a fifth N-channel MOS transistor having a gate receiving the third signal and a fifth P-channel MOS transistor having a gate receiving the fourth signal, said output circuit generating an output signal in response to the third and fourth signals.

2. The operational amplification circuit according to claim 1, wherein sources of the first and second N-channel MOS transistors are connected to a third current source circuit, and wherein sources of the first and second P-channel MOS transistors are connected to a fourth current source circuit.

3. The operational amplification circuit according to claim 1, wherein said first differential amplification circuit further includes a sixth P-channel MOS transistor having a source connected to a potential source, a gate, and a drain connected to the gate, and a seventh P-channel MOS transistor having a source connected to the potential source, a gate connected to the gate of the sixth P-channel MOS transistor, and a drain.

4. The operational amplification circuit according to claim 1, wherein said second differential amplification circuit further includes a sixth N-channel MOS transistor having a source connected to a ground potential, a gate, and a drain connected to the gate, and a seventh N-channel MOS transistor having a source connected to the ground potential, a gate connected to the gate of the sixth N-channel MOS transistor, and a drain.

5. An operational amplification circuit comprising:
a first differential amplification circuit including a first MOS transistor of a first conductivity type having a gate connected to a first input terminal, and a second MOS transistor of the first conductivity type having a gate connected to a second input terminal and generating a first signal having a voltage level which reflects a voltage difference between the first input terminal and the second input terminal;
a second differential amplification circuit including a third MOS transistor of the first conductivity type having a gate connected to the first input terminal, and a fourth MOS transistor of the first conductivity type having a gate connected to the second input terminal and generating a second signal having a voltage level which reflects a voltage difference between the second input terminal and the first input terminal;
a level shift circuit including a fifth MOS transistor of a second conductivity type having a gate receiving the first signal, and a sixth MOS transistor of the first conductivity type, said level shift circuit generating a third signal having a level that is shifted from the voltage of the first signal;
a current source circuit supplying a predetermined current to the sixth MOS transistor; and
an output circuit including a seventh MOS transistor of the first conductivity type having a gate receiving the third signal, and an eighth MOS transistor of the second conductivity type having a gate receiving the second signal.

6. The operational amplification circuit according to claim 2, further comprising:
a power-down circuit for controlling the seventh and eighth MOS transistors so as to be in an off-state in response to a power-down signal.

7. The operational amplification circuit according to claim 2, further comprising a phase compensation circuit connected between said first and second differential amplification circuits and said output circuit, for preventing an oscillation.

8. The operational amplification circuit according to claim 7, wherein the phase compensation circuit includes a first phase compensation circuit connected between said first differential amplification circuit and said output circuit, and a second phase compensation circuit connected between said second differential amplification circuit and said output circuit.

9. The operational amplification circuit according to claim 8, wherein the first phase compensation circuit includes
a capacitor having a first terminal connected to said first differential amplifier, and a second terminal, and
a ninth MOS transistor functioning as a resistor and connected between the second terminal of the capacitor and said output circuit.

10. The operational amplification circuit according to claim 8, wherein the second phase compensation circuit includes
a capacitor having a first terminal connected to said second differential amplifier, and a second terminal, and
a ninth MOS transistor functioning as a resistor and connected between the second terminal of the capacitor and said output circuit.

11. An operational amplification circuit comprising;
a first differential amplification circuit including a first MOS transistor of a first conductivity type having a gate connected to a first input terminal, and a second MOS transistor of the first conductivity type having a gate connected to a second input terminal, the first differential amplification circuit generating a first signal having an amplified voltage in accordance with a voltage difference between the first input terminal and the second input terminal;
a second differential amplification circuit including a third MOS transistor of a second conductivity type having a gate connected to the first input terminal, and a fourth MOS transistor of the second conductivity type having a gate connected to the second input terminal, the second differential amplification circuit generating a second signal having an amplified voltage in accordance with the voltage difference between the first input terminal and the second input terminal;
a first level shift circuit including a fifth MOS transistor of the second conductivity type having a gate receiving the first signal, and a sixth MOS transistor of the first conductivity type, said first level shift circuit generating a third signal having a level that is shifted from the voltage of the first signal;
a second level shift circuit including a seventh MOS transistor of the first conductivity type having a gate receiving the second signal, and an eighth MOS transistor of the second conductivity type, said second level shift circuit generating a fourth signal having a level that is shifted from the voltage of the second signal;
a first current source circuit supplying a first predetermined current to the sixth MOS transistor;
a second current source circuit supplying a second predetermined current to the eighth MOS transistor; and
an output circuit including a ninth MOS transistor of the first conductivity type having a gate receiving the third signal, and a tenth MOS transistor of the second conductivity type having a gate receiving the fourth signal, said output circuit generating an output signal in response to the third and fourth signals.

12. The operational amplification circuit according to claim 11, wherein sources of the first and second MOS transistors are connected to a third current source circuit, and wherein sources of the third and fourth MOS transistors are connected to a fourth current source circuit.

13. The operational amplification circuit according to claim 11, wherein said first differential amplification circuit further includes an eleventh MOS transistor of the second conductivity type having a source connected to a potential source, a gate, and a drain connected to the gate thereof and to a drain of the first MOS transistor, and a twelfth MOS transistor of the second conductivity type having a source connected to the potential source, a gate connected to the gate of the eleventh MOS transistor, and a drain connected to a drain of the second MOS transistor.

14. The operational amplification circuit according to claim 13, wherein the first signal is generated from a point at which the drains of the second and twelfth MOS transistors are connected.

15. The operational amplification circuit according to claim 11, wherein said second differential amplification circuit further includes an eleventh MOS transistor of the first conductivity type having a source connected to a ground potential, a gate, and a drain connected to the gate thereof and to a drain of the third MOS transistor, and a twelfth MOS transistor having a source connected to the ground potential, a gate connected to the gate of the eleventh MOS transistor, and a drain connected to a drain of the fourth transistor.

16. The operational amplification circuit according to claim 15, wherein the second signal is generated from a point at which the drains of the fourth and twelfth MOS transistors are connected.

* * * * *